(12) United States Patent
Cabauy et al.

(10) Patent No.: US 8,634,201 B1
(45) Date of Patent: Jan. 21, 2014

(54) RADIOISOTOPE POWER SOURCE PACKAGE FOR MICROELECTRONICS

(75) Inventors: Peter Cabauy, Miami, FL (US); Bret J. Elkind, Miami, FL (US); Denset Serralta, Miami, FL (US); Jesse Grant, Homestead, FL (US)

(73) Assignee: City Labs, Inc., Homestead, FL (US)

( * ) Notice: Subject to any disclaimer, the term of this patent is extended or adjusted under 35 U.S.C. 154(b) by 377 days.

(21) Appl. No.: 12/958,371

(22) Filed: Dec. 1, 2010

Related U.S. Application Data

(60) Provisional application No. 61/265,647, filed on Dec. 1, 2009.

(51) Int. Cl.
*H05K 1/16* (2006.01)

(52) U.S. Cl.
USPC .......... 361/766; 361/763; 361/782; 361/784; 361/795; 361/803

(58) Field of Classification Search
USPC ......... 361/763–766, 782–784, 792–795, 803; 257/690–692
See application file for complete search history.

(56) References Cited

U.S. PATENT DOCUMENTS

| | | | |
|---|---|---|---|
| 5,642,014 A | 6/1997 | Hillenius | |
| 6,407,929 B1 * | 6/2002 | Hale et al. | 361/763 |
| 6,970,362 B1 * | 11/2005 | Chakravorty | 361/782 |
| 6,998,692 B2 | 2/2006 | Sanchez | |
| 7,154,760 B2 * | 12/2006 | Konishi et al. | 361/783 |
| 7,411,283 B2 * | 8/2008 | Hockanson et al. | 257/678 |

OTHER PUBLICATIONS

Bower, Barbanel, Shreter, Bohnert; Reference book entitled Polymers, Phosphors, Voltaics Radioisotope Microbatteries, Published by CRC Press, LLC, 2000 Corporate Boulevard NW, Boca Raton, FL 33431, USA; Copyright 2002, pp. 15-27.
L.C. Olsen "Betavoltaic Energy Conversion", Energy Conversion vol. 13, pp. 117-127, Pergomon Press, 1973.
L.C. Olsen, "Review of Betavoltaic Energy Conversion" In NASA Lewis Research Center, Proceedings of the 12th Space Photovoltaic Research and Technology Conference (SPRAT 12) pp. 256-267.

* cited by examiner

*Primary Examiner* — Tuan T Dinh
(74) *Attorney, Agent, or Firm* — John L. DeAngelis; Beusse Wolter Sanks Mora & Maire, P.A.

(57) ABSTRACT

An assembly carrying a radioisotope power source for attaching to a printed circuit board. The assembly comprises an integrated circuit package carrying an integrated circuit, the integrated circuit package having first contacts on a lower surface thereof, the integrated circuit requiring connection to a power source, a power source package defining a cavity therein for carrying the radioisotope power source, the power source package having second contacts on an upper surface thereof contacting the first contacts and having third contacts on a lower surface thereof for contacting fourth contacts on the printed circuit board, the power source package having conductive vias extending from the second contacts on the upper surface of the power source package to the third contacts on the lower surface of the power source package, one or more of the vias having a fan-in segment, a fan-out segment and a substantially vertical segment therebetween, and electrical signals passing between the integrated circuit and the printed circuit board through the conductive vias and power passing from the radioisotope power source into the integrated circuit through one or more of the substantially vertical segments and the fan out segments.

1 Claim, 5 Drawing Sheets

RADIOISOTOPE POWER SOURCE PACKAGE FOR MICROELECTRONICS

CROSS REFERENCE TO RELATED APPLICATIONS

This application claims the benefit, under Section 119, of the provisional application filed on Dec. 1, 2009, assigned application No. 61/265,647 and entitled Radioisotope Power Source Package for Microelectronics.

BACKGROUND OF THE INVENTION

Microelectronic devices mounted on a circuit board often require long-term, independent battery power. For instance, SRAM memory requires a replaceable battery to backup information and can benefit significantly from a long-term, maintenance-free power source. Furthermore, the goal of a long-term, radioisotope-based, energy harvesting power source for microelectronic components has been sought for decades.

U.S. Pat. No. 5,642,014 discloses a self-powered semiconductor device in which a radioactive power source and an integrated circuit (IC) are formed on a substrate. The method of forming both components on the same substrate requires the integrated circuit manufacturer to substantially change its die configuration, thereby increasing the cost to the end-user or perhaps precluding use of the radioactive power solution altogether. For instance, an integrated radioactive power source on the IC can be problematic if radiation affects the device's performance by inducing bit flips in the bit stream or in memory. Furthermore, the radioactive power source may not provide sufficient power to the integrated circuit or SRAM due to the constraint of using only a minute area of the IC for the power source, while also being limited by the IC's substrate configuration.

U.S. Pat. No. 6,998,692 discloses a betavoltaic power source that is integrated into an IC package but separated from the IC's substrate and separately mounted into the IC package. This formulation allows for some reduction of the constraints present in U.S. Pat. No. 5,642,014; however, this design also suffers from integration problems with the IC manufacturing process, thereby increasing the cost to the end-user. This cost increase may preclude the use of a radioactive power source, if the IC manufacturer is not willing to integrate a radioactive power source into the IC package. The integrated circuit is also prone to radiation effects that are dependent upon the nature of the selected radioisotope species, shielding requirements, and proximity of the IC and power source within the IC package.

In the case of field programmable gate arrays (FPGAs), the highest level of encryption security is dependent upon battery-backed SRAM to maintain encryption keys. Unfortunately, the dependability of conventional chemical-based batteries, e.g. lithium, nickel-cadmium, alkaline cells, has reduced the reliability of encryption security in FPGAs. This reliability issue has necessitated the frequent replacement of batteries on circuit boards to maintain FPGA encryption security. This replacement feature has caused an inefficient use of circuit board real estate due to the introduction of special component holders for chemically-based coin-cell batteries and other form-factor batteries. In addition, requirements for chemical battery replacement necessitate easy operator-access to the battery on the circuit board. This has created a fundamental weakness in encryption security due to the presence of exposed (and easily accessible) battery leads, thereby making such configurations more susceptible to reverse engineering attacks.

Those skilled in the art of reverse engineering have recently found that a reduced level of security exists when the FPGA's encryption key power lead connections are easily accessible; such accessibility leads to an increased susceptibility to tamper/reverse engineering attempts.

The disadvantages associated with the use of chemical-based batteries can be surmounted through use of radioisotope power sources, which are gradually being introduced into the microelectronics market. However, the radioisotope power sources also introduce disadvantages that must be overcome to secure their widespread adoption.

BRIEF DESCRIPTION OF THE FIGURES

The invention is explained in the following description in view of the drawings that show.

DETAILED DESCRIPTION OF THE INVENTION

Figure 1:
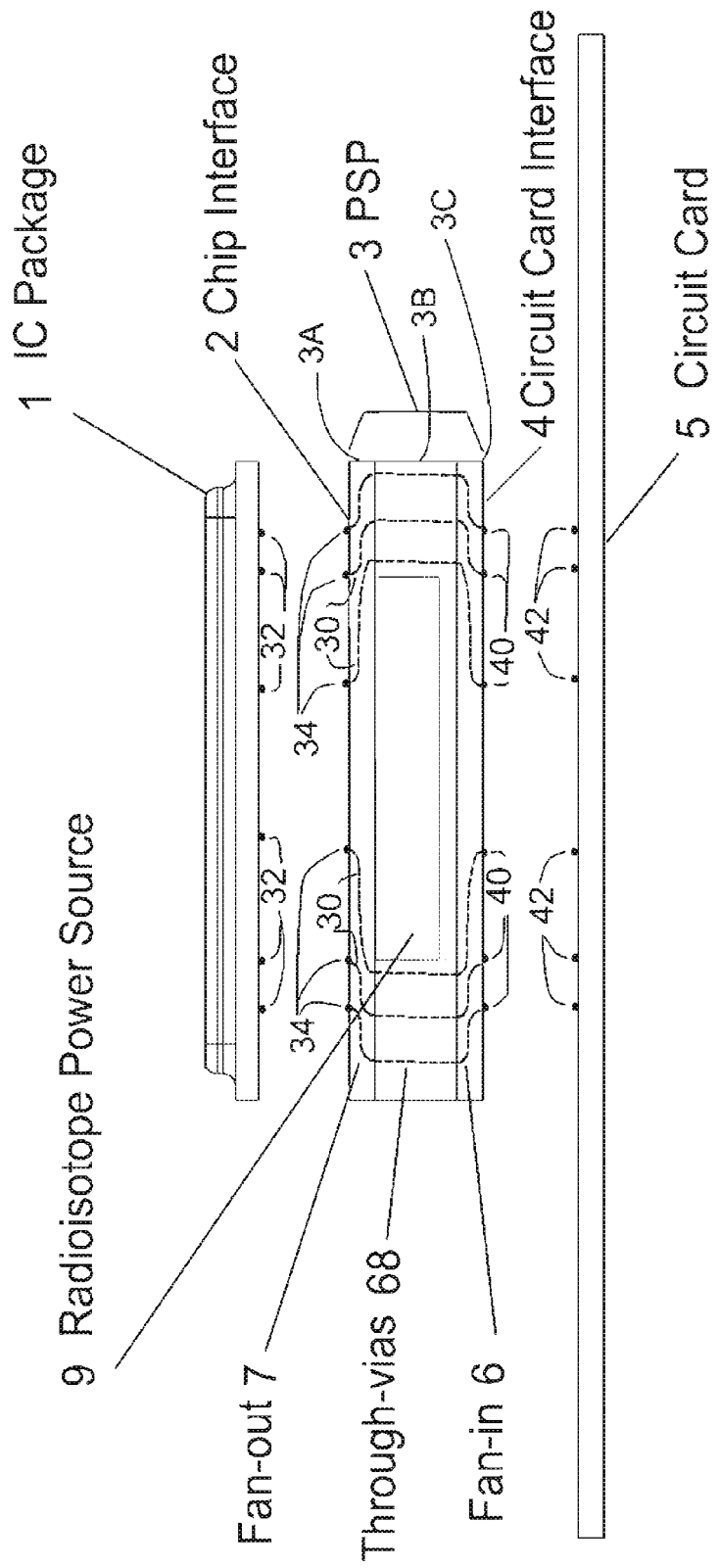
FIGS. 1, 2, and 3 are cross-sectional views of various different embodiments of a radioisotope power source package according to the present invention.

Before describing in detail the particular apparatus and method related to radioisotope power sources and packages therefor in accordance with various aspects of the present invention, it should be observed that the present invention, in its various embodiments, resides primarily in a novel and non-obvious combination of hardware and method steps related to this apparatus and method. Accordingly, the hardware elements and method steps have been represented by conventional elements in the drawings, showing only those specific details that are pertinent to the present invention, so as not to obscure the disclosure with structural details that will be readily apparent to those skilled in the art having the benefit of the description herein.

The following embodiments are not intended to define limits of the structures or methods of the invention, but only to provide exemplary constructions. The embodiments are permissive rather than mandatory and illustrative rather than exhaustive.

The present invention overcomes the disadvantages of the prior art as described above. A radioisotope power source serves as a substitute for conventional chemical-based batteries, and the packaging schemes according to the present invention permit use of such power sources with microelectronics devices.

The various embodiments of the present invention describe a power source package (PSP) that eliminates the need for alterations to the IC die and/or the IC package, which are known disadvantages to the widespread adoption of radioisotope power sources. The package embodiments of the present invention also provide sufficient shielding of the IC so as to not adversely affect the IC's performance. The shielding material of the PSP depends on the radioisotope that is used to generate the power. For example, for radioisotopes such as Promethium-147, Krypton-85, Strontium-90, etc, metal surfaces may be required to provide sufficient shielding. For Tritium radioisotopes, a PSP comprising ceramic material is sufficient for the purposes of shielding. In general, Tritium beta radiation may be shielded with very thin metals, polymers, or even a sheet of paper. In addition, the packaging schemes offer economical use of the circuit board real estate, thereby providing the designer with the freedom to select IC components and circuit board designs as if a power source/battery was not present.

In the present invention, the radioactive power source is hermetically or non-hermetically housed within a type of IC package hereinafter referred to as a power source package (PSP) 3. See FIG. 1. The PSP 3 is independent and separate from an IC package 1, i.e., the IC package requiring battery power. The PSP 3 is mounted on a circuit board or circuit card 5 with the IC package 1 that requires battery power. In one embodiment the IC package 1 is mounted atop the PSP 3, as shown in FIG. 1, with conductors 30 passing through the PSP 3.

The IC package contacts 32 mate to corresponding contacts 34 on a top surface of the PSP 3 along an interface surface 2. The conductors 30 within the PSP fan out, as indicated by reference character 7, within an upper region 3A of the PSP 3 to circumnavigate a radioactive power source 9 within the PSP 3, specifically within an intermediate region 3B. The region 3B also comprises through-vias 8 outside the region of the power source 9 and a cavity within the intermediate region 3B for carrying the power source 9. In a lower region 3C, the conductors fan back in as indicated by a reference character 6, terminating in contacts 40 that mate with corresponding contacts 42 on the circuit board or circuit card 5 at an interface surface 4. Electrical signals pass between the integrated circuit within the integrated circuit package 1 and the circuit board or card 5 through the conductors 30.

In one embodiment, the IC contact arrangement on the circuit board 5 is identical to the arrangement of the contacts 32 on the IC package 1. Thus the IC can be inserted into the circuit board contacts but for the presence of the intervening PSP 3. This feature is especially advantageous as it permits space-efficient and easy connection of a power source package to an existing IC without rerouting conductor paths. Thus the radioactive power source 9 carried by the PSP 3 can be mounted onto any existing circuit board without changing the configuration of the PSP contacts, the circuit board contacts or the IC package contacts. Thus on-board on on-chip power can be easily supplied to the integrated circuit.

The PSP's radioactive power source leads (not illustrated in FIG. 1) may be connected to the IC package's power contacts through a number of different paths, (also not illustrated in FIG. 1) such as, but not limited to, a connection of the PSP's power source leads to through-vias or directly to either the circuit board's power supply contacts (among the illustrated contacts 42) or the IC package's power supply (among the illustrated contacts 32). This arrangement can minimize exposure of the power source leads to the IC package, as opposed to the conventional and easily accessible configuration where the battery is externally placed on a circuit board. In the PSP configuration, the hidden battery (power source) and associated connections provide higher security from reverse engineering, e.g. as in powering FPGA encryption keys. In addition, the PSP's power connections to through-vias or contacts may be intentionally obfuscated with the many PSP vias and contacts 8, 30 and 34 bridging around the PSP, thereby mitigating the probability of a successful tamper event. Additionally, obfuscation may be incorporated into the design, on a unit-by-unit basis, by randomly positioning the power lead connections in the PSP for a particular configuration; this feature may serve as a disincentive to a reverse engineering attempt or the development of a tamper solution effort, since each PSP power lead pathway is distinctive and possibly unique, e.g. a single tamper solution for one unit will not apply globally to all other manufactured units. Furthermore, the present invention increases the security of the IC by providing a high reliability, long term radioisotope power source embedded within the PSP with hidden power connection leads to the IC.

In another embodiment, the PSP 3 provides power lead connections directly to the circuit board or card 5 to concurrently or exclusively power other microelectronic components on the circuit board or card 5.

In one embodiment, the radioisotope power source 9 within the PSP 3 is an indirect or direct conversion betavoltaic battery or cell as described in the literature (e.g., L.C. Olsen "*Betavoltaic Energy Conversion*", *Energy Conversion* 13, 117, 1973; *Polymers, Phosphors, and Voltaics for Radioisotope Microbatteries* by Kenneth E. Bower et. al.; *Review of Beta voltaic Energy Conversion In NASA. Lewis Research Center, Proceedings of the* 12*th Space Photovoltaic Research and Technology Conference* (SPRAT 12) p 256-267 (See N94-11380 01-20)).

In one embodiment of the present invention, the IC (within the IC package 1) and its corresponding package comprises an FPGA, such as Xilinx' Virtex Series FPGA, with contacts in the form of a ball grid array (BGA). The number of BGA contacts can easily reach into the hundreds and even thousands. Thus the contacts 32, 34, 40, and 42 may be in the form of ball grid array contacts, or other contact types known in the IC industry.

In one embodiment, the PSP 3 comprises a single monolithic ceramic component comprised of multiple layers of ceramic material such as a low or high temperature co-fired ceramic (LTCC or HTCC). The IC interface 2 (on an upper surface of the PSP 3) distributes these connections through multiple ceramic layers, such as alumina and aluminum nitride, as known by those skilled in the art. Implementation of through-vias to fan out and to fan in the conductors, relative to the PSP's perimeter, can then be accomplished.

This dense packing scheme, especially of the BGA, allows a region in the center of the PSP 3 to accommodate a radioisotope power source that provides power to the IC for maintaining encryption keys, powering components, or providing auxiliary power to devices on or attached to the PSP 3 or on the circuit board 5.

Figure 2:
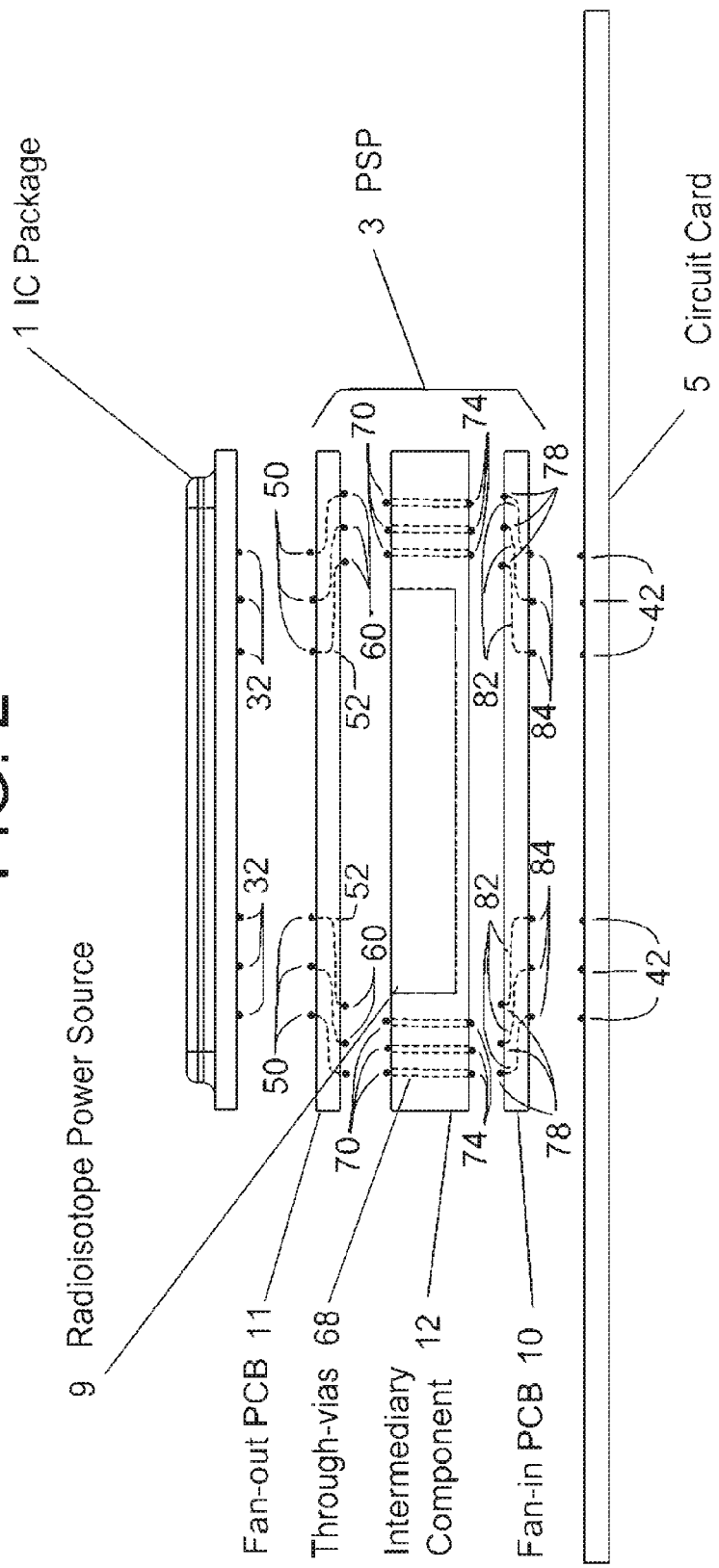

In yet another embodiment illustrated in FIG. 2, the PSP 3 is formed of three components 10, 11, and 12, also respectively referred to as a fan-in component 10, an intermediate component 11, and a fan-out component 12. The component 11 comprises contacts 50 on an upper surface thereof that mate with or contact the contacts 32 on a lower surface of the IC package 1. The contacts 50 and 32 may each comprise a BGA, and the IC package 1 may enclose an FPGA.

The intermediate component 12 may be comprised of LTCC or HTCC and is designed to house the radioisotope power source 9 and its concomitant lead structures. This embodiment allows for a high degree of scalability. For example, a height of the intermediate component 12 can be increased to accommodate more radioisotope power cells to increase the power supplied. The modular design of the PSP 3 (and its three components 10, 11, and 12) allows for combinations of interposing sections and center sections to accommodate a wide range of IC applications and power demands.

Figure 4:
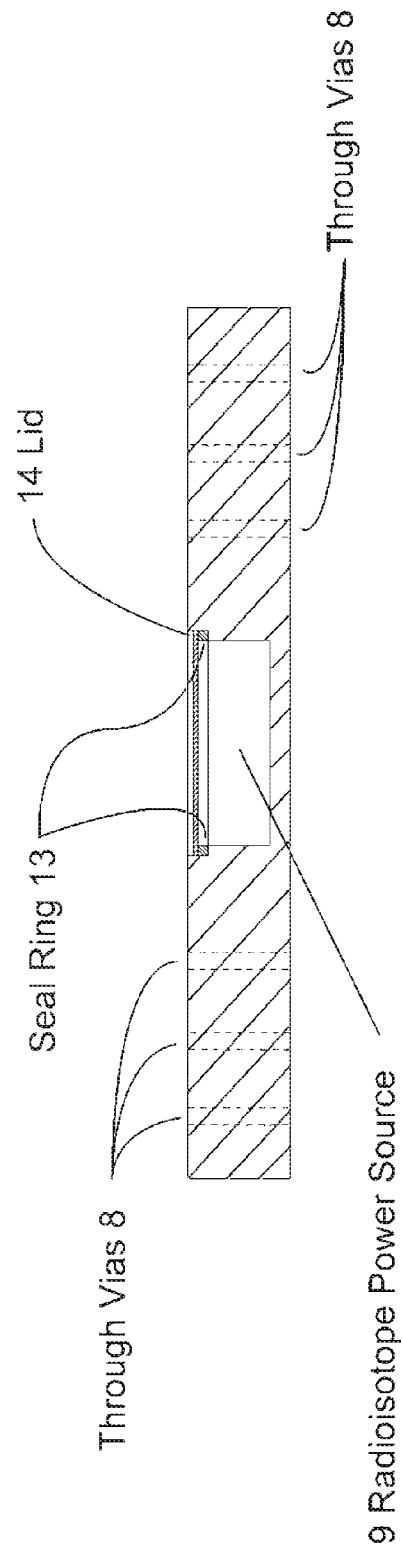
FIG. 4 is a detailed side view of an intermediate component of FIGS. 1-3.
Figure 5:
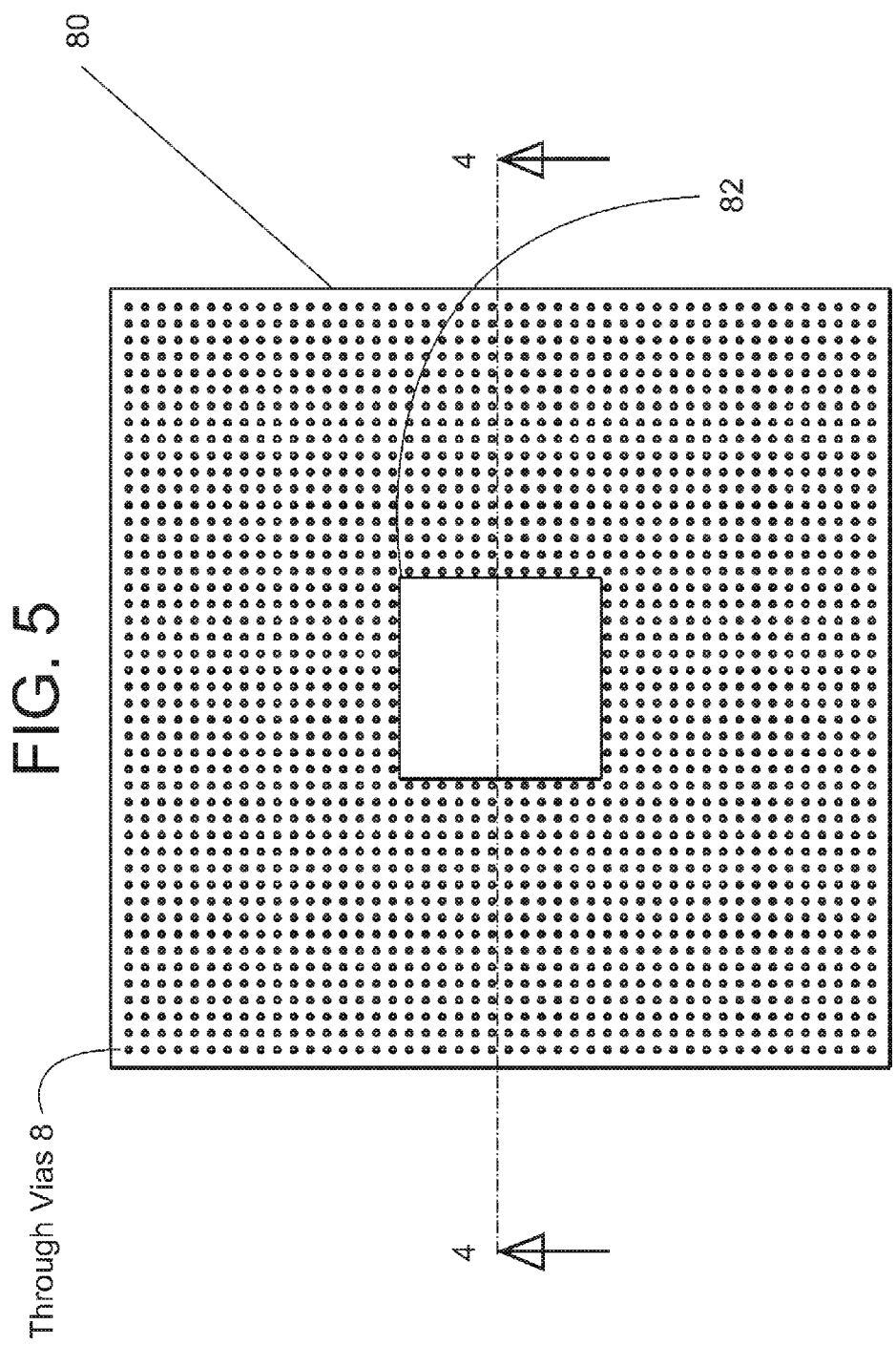
FIG. 5 is a cross-section through FIG. 4.

The intermediate component 12 also incorporates vertically oriented vias 68 that can populate the through-thickness dimension of the intermediate component 12; the spacing, shape (besides a vertically-oriented shape), and pitch density can be modified to distribute vias from an outer wall 80 to an inner wall 82 (See FIGS. 4 and 5) of the volume housing the radioactive power source 9. The vertically-oriented vias 68 terminate in contacts 70 that mate to the contacts 60 of the fan-out component 11.

In a similar fashion, contacts 74 (see FIG. 2) are disposed on a lower surface of the intermediate component 12 and are formed as lower termination points of the through-vias 68. The contacts 74 mate with the contacts 78 on an upper surface of the fan-in component 10. The fan-in component 10 may comprise a polymeric circuit board for fanning leads or conductive paths 82 back in toward a centerline of the PSP. The conductive paths 82 terminate in contacts 84 on a lower surface of the fan-in component 10. The contacts 84 mate with the contacts 42 on the upper surface of the circuit card or board 5.

It may be desired for the alignment of the contacts 32 on the lower surface of the IC package 1 to mirror the alignment of the contacts 84 on lower surface of the fan-in component 10 to permit the present invention to offer an exact drop-in solution to the problems of the prior art. Such a drop-in solution is especially attractive when an off-the-shelf IC package has been used by a system-provider who has already committed to a particular IC package form-factor and pin layout, and who has already mass produced circuit boards that match the IC package's contacts. In this case, the "drop-in" solution is of significant benefit to the system-provider since it will not incur any additional cost in reconfiguring the circuit board.

For example, in the embodiment illustrated in FIG. 2, the contacts 84 on the lower surface of the fan-in component 10 are in the same arrangement as the contacts 32 on the lower surface of the IC package 1. This alignment feature can be implemented in any embodiments of the present invention, and permits installation of the PSP 3 directly below the IC 1, without requiring modification of the contacts 42 on the printed circuit board 5 or the contacts 32/84 The IC package 1 can simply be removed from the circuit card 5, the PSP contacts 84 mated with the contacts 42 on the printed circuit card 5 and the IC package 1 installed on the PSP 3, mating the contacts 32 with the contacts 50.

Conversely, if the system-provider has a circuit board that does not match the desired IC package pin layout, the solution of the present invention facilitates using a PSP to bridge between the new IC package contact arrangement and the contact arrangement on the existing board. Contacts on a top surface of the PSP 3 can be designed to mate with the contacts on the bottom surface of the IC package 1, and contacts on the bottom surface of the PSP 3 can be designed to mate with the contacts on the surface of the printed circuit card 5.

Integration of the three components 10, 11, and 12 of the PSP 3, as well as the interconnecting contacts and vias, is accomplished through various skills known in the art.

Figure 3:
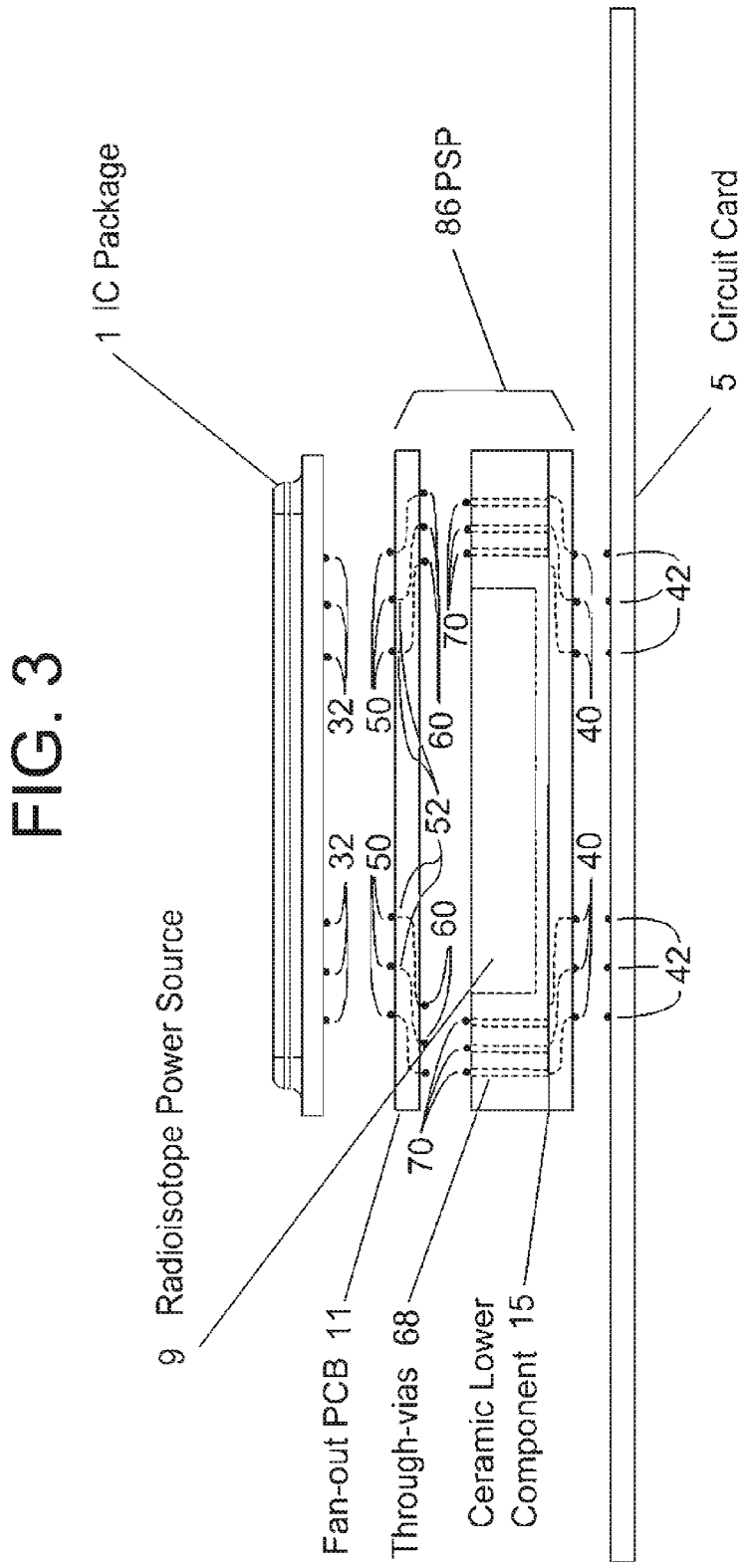

In another embodiment illustrated in FIG. 3, the PSP 3 comprises two components whereby both the intermediate component 12 and the fan-in component 10 (of FIG. 2) are replaced by a single monolithic LTCC or HTCC element 86 as shown in FIG. 3. In this embodiment, the element 86 both bridges and fans-out the leads within a single component of ceramic material. The leads fan-out within a region 15 of the element 86. The contacts 70 on an upper surface of the single monolithic element 86 are compatible with and mate to the contacts 60 on the lower surface of the fan-out component 11. The contacts 40 on a lower surface of the element 86 mate with the contacts 42 on the upper surface of the circuit card 5. These various contacts may comprise a BGA.

In the various presented embodiments, the radioisotope power source 9 is within a cavity that is hermetically sealed. For instance, a Kovar seal ring 13 and a Kovar lid 14 (shown in cross-section in FIGS. 4 and 5) provide hermeticity through use of any of a number of sealing technologies e.g. seam sealing, laser welding, or brazing, which are well known to those skilled in the art.

In general, the various presented embodiments of the PSP can prevent reverse engineering by incorporating tamper-prevention/security meshes. These meshes encapsulate all or portions of the IC, the IC package 1, the circuit board 5, components mounted on the circuit board 5 and the various components of the PSP 3 as described in the various embodiments above. Typically, tamper-prevention meshes (e.g., active and passive tamper-prevention meshes) comprise sensors that detect an intrusion or tamper event. For example, such meshes may measure the conductivity or resistivity and detect a change in that parameter. If a change is detected, a penalty is applied, e.g., erasure of the encryption keys or destruction of the part by explosion. These meshes, with appropriate microelectronics devices and power supplies, e.g., a PSP, can lead to effective tamper responses, such as erasure of critical information such as the encryption keys referred to above.

Also, the components of the PSP 3 comprising the through-vias can be used in conjunction with a device that examines changes in voltage (e.g. a voltage comparator) to determine if a tamper event has occurred. For instance, a dedicated IC that measures the differences in voltage may be coupled to various points on the conductive mesh. If a voltage difference outside a predetermined range is detected, then the penalty may be implemented, e.g. erasure of stored information.

The use of an under-fill compound to surround and encapsulate the connections between structures, components of the PSP, and/or ICs provides an additional barrier for reverse engineering deterrence and tamper prevention.

In yet another embodiment, the PSP's sidewalls may be protected by an enhanced security mesh such as a Gore D3 tamper-prevention mesh membrane (manufactured by W. L. Gore of Newark, Del.) that is powered by the PSP radioisotope power source while simultaneously powering an IC. This embodiment further protects the power leads to the IC package in the event of a tamper incursion; thereby resulting in enhanced security for the IC package.

In another embodiment, the PSP's sidewalls may be protected by a passive tamper-prevention mesh that does not require an independent power supply. Such passive tamper-prevention meshes are known in the art.

In another embodiment, the PSP 3 may incorporate or power other volume protection devices for the prevention of reverse engineering.

In another embodiment, an IC or set of IC's may be embedded within and/or powered by the PSP, e.g. a dedicated voltage comparator (for tamper detection as described above) or a power management IC.

In another embodiment, a modular PSP design can accommodate multiple chips from a series or family of ICs.

In another embodiment, direct conductive connections between the PSP 3 and the IC package 1 are eliminated through the use of inductive coupling to transmit power or signals.

While various embodiments of the present invention have been shown and described herein, it will be obvious that such embodiments are provided by way of example only. Numerous variations, changes and substitutions may be made without departing from the invention herein. Accordingly, it is intended that the invention be limited only by the spirit and scope of the appended claims.

What is claimed is:

1. An assembly carrying a radioisotope power source for attaching to a printed circuit board, the assembly comprising:

an integrated circuit package carrying an integrated circuit, the integrated circuit package having first contacts on a lower surface thereof, the integrated circuit requiring connection to a power source;

a power source package defining a cavity therein for carrying the radioisotope power source, the power source package having second contacts on an upper surface thereof contacting the first contacts and having third contacts on a lower surface thereof for contacting fourth contacts on the printed circuit board;

the power source package having conductive vias extending from the second contacts on the upper surface of the power source package to the third contacts on the lower surface of the power source package, one or more of the vias having a fan-in segment, a fan-out segment and a substantially vertical segment therebetween;

wherein the radioisotope power source is hermetically sealed within the cavity by a seal ring disposed in an upper region of the cavity and a lid closing the cavity; and electrical signals passing between the integrated circuit and the printed circuit board through the conductive vias and power passing from the radioisotope power source into the integrated circuit through one or more of the substantially vertical segments and the fan out segments.

* * * * *